US007001786B2

(12) United States Patent
Yamaya et al.

(10) Patent No.: US 7,001,786 B2
(45) Date of Patent: Feb. 21, 2006

(54) SEMICONDUCTOR DEVICE AND METHOD FOR FABRICATING THE SAME

(75) Inventors: Kazufumi Yamaya, Nara (JP); Koji Shimomura, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/040,000

(22) Filed: Jan. 24, 2005

(65) Prior Publication Data

US 2005/0127509 A1 Jun. 16, 2005

Related U.S. Application Data

(62) Division of application No. 10/365,408, filed on Feb. 13, 2003, now Pat. No. 6,853,078.

(30) Foreign Application Priority Data

Feb. 22, 2002 (JP) ............................ 2002-045672

(51) Int. Cl.
*H01L 21/66* (2006.01)

(52) U.S. Cl. ............................ 438/18; 438/14; 438/17

(58) Field of Classification Search .................. 438/14, 438/17, 18, 107
See application file for complete search history.

(56) References Cited

U.S. PATENT DOCUMENTS 6,451,681 B1 9/2002 Geer
2002/0139976 A1 * 10/2002 Hembree et al. ............ 257/48

FOREIGN PATENT DOCUMENTS

JP 2000-294607 A 10/2000
JP 2001-94043 A 4/2001
JP 2002-48839 A 2/2002

* cited by examiner

*Primary Examiner*—Bradley K. Smith
(74) *Attorney, Agent, or Firm*—McDermott Will & Emery LLP

(57) ABSTRACT

On a substrate provided with a transistor, an electrode pad for product connected electrically to the transistor is formed. A metal bump is provided on a surface of the electrode pad for product. An electrode pad for test to be used specifically for a wafer-level burn-in, which is connected electrically to the transistor, is further formed on the substrate.

4 Claims, 12 Drawing Sheets

SEMICONDUCTOR DEVICE AND METHOD FOR FABRICATING THE SAME

CROSS-REFERENCE TO RELATED APPLICATIONS

This application is a divisional of application Ser. No. 10/365,408 filed Feb. 13, 2003.

BACKGROUND OF THE INVENTION

The present invention relates to a semiconductor device in which a metal bump is provided on an electrode pad connected electrically to a transistor, such as a liquid crystal driver, and to a method for fabricating the same.

A semiconductor device in which gold bumps or the like are provided on electrode pads, e.g., a liquid crystal driver uses a packaging technique such as a TCP (Tape Carrier Package) or COG (Chip On Glass), which is different from a ceramic/plastic package represented by CSP (Chip Size Package) or QFP (Quad Flat Package).

In an LSI product in which metal bumps are formed on electrode pads prior to shipment (hereinafter referred to as a product with metal bumps), it is essential to preliminarily form metal bumps before a probe test is performed thereon for the following reason.

FIG. 17 shows a probe test performed on a conventional product with metal bumps. In the conventional product with metal bumps, a plurality of electrode pads 92 connected electrically to a transistor (not shown) are formed on a substrate 91 provided with the transistor, as shown in FIG. 17. Gold bumps 93 are formed on the respective electrode pads 92 so that the probe test is performed by bringing the probe terminals 94 of a probe tester (not shown) into contact with the respective gold bumps 93. If a probe test is performed on the product with metal bumps shown in FIG. 17 before the formation of the gold bumps 93, the surface portions of the electrode pads 92 are damaged by the probe terminals 94 in contact therewith, as shown in, e.g., FIG. 18. If the gold bumps 93 are formed by plating growth on the electrode pads 92 after the probe test, a gold plated film grows abnormally to deform the gold bumps 93, as shown in FIG. 19, and thereby reduce the reliability. It is therefore necessary to perform a probe test on the product with metal bumps after the formation of the metal bumps.

However, the conventional product with metal bumps has the problem that a burn-in for quality assurance cannot be performed with respect thereto after dicing. Specifically, the problems are encountered that a product mounted on tapes such as a TCP is hard to handle during a burn-in performed with respect thereto and exhibits poor matching with a burn-in system since the tapes are mostly custom-made. If the conventional product with metal bumps is an unpackaged item such as a COG, it cannot be tested by a normal burn-in method. Thus, it is extremely difficult to perform a normal burn-in with respect to the conventional product with metal bumps.

SUMMARY OF THE INVENTION

In view of the foregoing, it is therefore an object of the present invention to stably perform a burn-in with respect to a semiconductor device in which a metal bump is provided on an electrode pad connected electrically to a transistor.

To attain the object, the present inventors have examined a method of performing a wafer-level burn-in with respect to a product with metal bumps prior to dicing.

In the case of performing a wafer-level burn-in, a preliminary probe test is performed on a semiconductor wafer having a plurality of semiconductor integrated circuit chips (hereinafter referred to as chips) each of which is a product with metal bumps and then a burn-in is performed only on good chips on the semiconductor wafer. Thereafter, a final probe test is performed on each of the good chips. The object of performing the preliminary probe test is to prevent the situation in which a current is localized to a faulty chip upon the application of a voltage in the burn-in and the voltage is no more applied to the good chips.

FIG. 20 shows a wafer-level burn-in performed on trial by the present inventors on a product with metal bumps prior to dicing. The description of the components shown in FIG. 20 which are the same as composing the product with metal bumps shown in FIG. 17 will be omitted by retaining the same reference numerals.

As shown in FIG. 20, the burn-in is performed by aligning electrode terminals 96 composed of metal bumps of a burn-in system 95 with respect to the electrode pads 92 of the product with metal bumps and applying voltage from the electrode terminals 96 to the electrode pads 92 via gold bumps 93. In the burn-in, the voltage is applied from the electrode terminals 96 to only some of the plurality of electrode pads 92 provided at the product with metal bumps.

However, the problem occurs that it is difficult to provide stable contact between the gold bumps 93 on the pads 92 and the electrode terminals 96 due to the size (about 100 μm) of each of the electrode terminals 96 of the burn-in system 95 which is large compared with the size of each of the pads 92 (about 50 μm) and with the spacing (about 50 μm) between the pads 92, as shown in FIG. 20. In addition, the preliminary probe test should be performed on the product with metal bumps after the formation of the gold bumps 93 as described above, while it is more difficult to provide contact between the pads 92 and the electrode terminals 96 via the gold bumps 93 since the electrode terminals 96 easily slip down from the gold bumps 93.

To eliminate the difficulties, the present inventors have invented a method in which electrode pads for test without metal bumps are provided in products with metal bumps in addition to electrode pads for products formed with metal bumps so that stable contact is provided between the test electrode pads of the products with metal bumps and the electrode terminals of the burn-in system during a wafer-level burn-in.

Specifically, a semiconductor device according to the present invention comprises: a transistor formed on a substrate; an electrode pad for product having a metal bump provided on a surface thereof, the electrode pad for product being formed on the substrate and connected electrically to the transistor; and an electrode pad for test to be used exclusively for a wafer-level burn-in, the electrode pad for test being formed on the substrate and connected electrically to the transistor.

In the semiconductor device according to the present invention, the electrode pad for test to be used specifically for a wafer-level burn-in is provided in addition to the electrode pad for product having the metal bump provided on the surface thereof This allows contact between the electrode pad for test and the electrode terminal of a burn-in system without using the electrode pad for product with a metal bump which is difficult to bring into contact with the electrode terminal of the burn-in system during a wafer-level burn-in so that the burn-in is performed stably.

In the semiconductor device according to the present invention, the electrode pad for test preferably has a surface covered with a barrier metal film.

The arrangement prevents corrosion of the electrode pad for test in an atmosphere and thereby allows a reliable wafer-level burn-in to be performed.

Preferably, the semiconductor device according to the present invention further comprises: a wire formed on the substrate and connected electrically to the transistor; and an insulating film formed on the substrate and on the wire, a depressed portion reaching the wire being formed in the insulating film, the electrode pad for test being composed of a region of the wire underlying the depressed portion.

The arrangement provides more stable contact between the electrode terminal of the burn-in system and the electrode pad for test with the electrode terminal being fitted in the depressed portion so that a wafer-level burn-in is performed reliably. Since a metal bump is not provided on the electrode pad for test in the depressed portion, there is no probability of a short circuit occurring between the electrode pad for test and another terminal in the semiconductor device when the semiconductor device is assembled in a package.

Preferably, the semiconductor device according to the present invention further comprises: another electrode pad for product having a metal bump provided on a surface thereof, the other electrode pad for product being formed on the substrate, the electrode pad for product, the electrode pad for test, and the other electrode pad for product being positioned on the same straight line.

The arrangement allows easy layout of an integrated circuit.

Preferably, the semiconductor device according to the present invention further comprises: another electrode pad for product having a metal bump provided on a surface thereof, the other electrode pad for product being formed on the substrate, the electrode pad for test being disposed between a pair of wires connected individually to the electrode pad for product and to the other electrode pad for product.

The arrangement achieves a reduction in the area of the integrated circuit.

In the semiconductor device according to the present invention, an area of the electrode pad for test is preferably double an area of the electrode pad for product or more.

The arrangement more easily allows contact between the electrode pad for test and the electrode terminal of the burn-in system. Preferably, the electrode pad for test is disposed at the largest possible distance from the electrode pad for product. This far more easily allows contact between the electrode terminal of the burn-in system and the electrode pad for test.

A method for fabricating a semiconductor device according to the present invention comprises the steps of: forming a transistor on a substrate; forming, on the substrate, a wire connected electrically to the transistor; forming an insulating film on the substrate and on the wire; forming a first depressed portion and a second depressed portion in the insulating film such that each of the first and second depressed portions reaches the wire and thereby forming an electrode pad for product composed of a region of the wire underlying the first depressed portion and an electrode pad for test composed of a region of the wire underlying the second depressed portion; and forming a metal bump on the electrode pad for product.

In accordance with the method for fabricating a semiconductor device of the present invention, the electrode pad for test is formed in addition to the electrode pad for product having the metal bump provided on the surface thereof This allows contact between the electrode pad for test and the electrode terminal of a burn-in system without using the electrode pad for product with a metal bump which is difficult to bring into contact with the electrode terminal of the burn-in system during a wafer-level burn-in so that the burn-in is performed stably.

In accordance with the method for fabricating a semiconductor device of the present invention, the first and second depressed portions are formed in the insulating film to reach the wire so that the electrode pad for product composed of the region of the wire underlying the first depressed portion and the electrode pad for test composed of the region of the wire underlying the second depressed portion are formed. This allows contact between the electrode terminal of the burn-in system and the electrode pad for test with the electrode terminal being fitted in the second depressed portion so that a wafer-level burn-in is performed more stably. Since a metal bump is not provided on the electrode pad for test in the second depressed portion, there is no probability of a short circuit occurring between the electrode pad for test and another terminal in the semiconductor device when the semiconductor device is assembled in a package.

Preferably, the method for fabricating a semiconductor device according to the present invention further comprises, between the step of forming the electrode pad for product and the electrode pad for test and the step of forming the metal bump, the step of: forming a barrier metal film on each of the electrode pad for product and the electrode pad for test.

The arrangement prevents corrosion of the electrode pad for test in an atmosphere and thereby allows a more reliable wafer-level burn-in to be performed.

In this case, the step of forming the barrier metal film preferably includes the step of forming the barrier metal film over an entire surface of the insulating film including the first and second depressed portions, the method further comprising, after the step of forming the metal bump, the step of: cutting off a portion of the barrier metal film connecting the electrode pad for product and the electrode pad for test to each other.

The arrangement allows the barrier metal film for forming the metal bump on the electrode pad for product to be formed easily also on the electrode pad for test.

A wafer-level burn-in method according to the present invention assumes a wafer-level burn-in method for performing a burn-in with respect to a semiconductor wafer provided with a plurality of semiconductor integrated circuit chips each having a transistor, an electrode for product connected electrically to the transistor and having a metal bump provided on a surface thereof, and an electrode pad for test connected electrically to the transistor to be used specifically for a wafer-level burn-in, the method comprising the steps of: performing a probe test on the plurality of semiconductor integrated circuit chips by using the electrode pad for product; performing an insulating treatment with respect to the electrode pad for test of the faulty one of the plurality of semiconductor integrated circuit chips determined to be faulty in the step of performing the probe test; and after the step of performing the insulating treatment, performing a wafer-level burn-in using the electrode pad for test with respect to the good one of the plurality of semiconductor integrated circuit chips determined to be good in the step of performing the probe test.

The wafer-level burn-in method according to the present invention allows contact between the electrode pad for test and the electrode terminal of a burn-in system without using the electrode pad for product with a metal bump which is difficult to bring into contact with the electrode terminal of the burn-in system during a wafer-level burn-in so that the burn-in is performed stably.

The wafer-level burn-in method according to the present invention also performs the probe test (preliminary probe test) on each of the chips (semiconductor integrated circuit chips) and then performs the insulating treatment with respect to the electrode pad for test of the chip determined to be faulty before performing the wafer-level burn-in. As a result, electrical conduction does not occur between the electrode pad for test of the faulty chip and the electrode terminal of the burn-in system during the wafer-level burn-in so that the burn-in is not performed with respect to the faulty chip. This prevents a current from being localized to the faulty chip during the wafer-level burn-in and prevents the situation in which the current does not flow to the good chip so that the burn-in is performed reliably.

Since the wafer-level burn-in method according to the present invention does not provide a metal bump on the electrode pad for test, the insulating treatment can be performed easily with respect to the electrode pad for test of the faulty chip.

Preferably, the wafer-level burn-in method according to the present invention further comprises, after the step of performing the wafer-level burn-in, the step of: performing a probe test on the good chip by using the electrode pad for product.

The arrangement allows the screening of a chip which was determined to be good in the preliminary probe test but has become faulty as a result of the wafer-level burn-in.

Preferably, the wafer-level burn-in method according to the present invention further comprises, after the step of performing the wafer-level burn-in, the step of: individualizing the good chip by dicing the semiconductor wafer, packaging the individualized good chip, and then performing a final test on the packaged good chip.

The arrangement allows the screening of a chip which was determined to be good in the preliminary probe test but has become faulty as a result of the wafer-level burn-in or an assembling step such as dicing or packaging and thereby prevents the faulty chip from being shipped. It is also possible to perform, between the wafer-level burn-in and the assembling step, an additional probe test for screening a chip which has become faulty as a result of the wafer-level burn-in.

In the wafer-level burn-in method according to the present invention, the step of performing the wafer-level burn-in is performed preferably while preventing contact between the metal bump of the good chip and a burn-in system.

The arrangement allows a reliable wafer-level burn-in to be performed. Specifically, contact between the metal bump on the chip and the burn-in system can be prevented by adjusting the height of the electrode terminal of the burn-in system to be larger than the height of the metal bump on the chip (the height of the metal bump includes the height of the portion thereof formed in the depressed portion if the electrode pad for product is formed in the depressed portion).

DETAILED DESCRIPTION OF THE DRAWINGS

Embodiment 1

Figure 1:
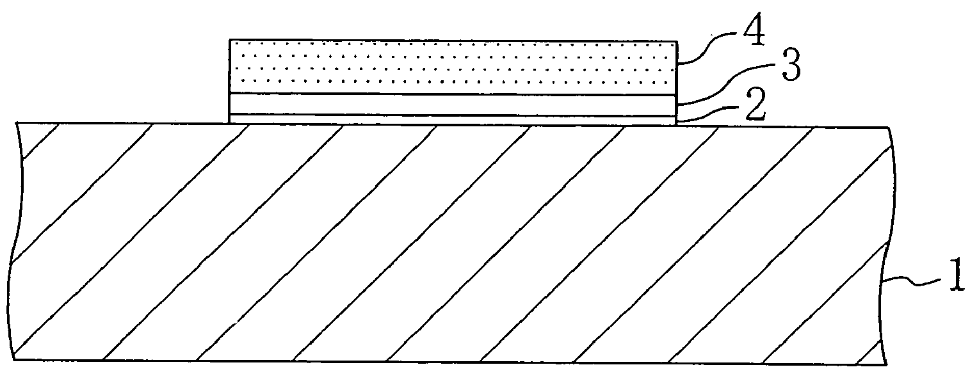
FIG. 1 is a cross-sectional view illustrating one of the process steps of a method for fabricating a semiconductor device according to a first embodiment of the present invention.

Referring to the drawings, a semiconductor device and a method for fabricating the same according to a first embodiment of the present invention will be described by using, as an example, a semiconductor device having a typical MOS structure using a p-type semiconductor substrate.

FIGS. 1 to 12 are cross-sectional views illustrating the individual process steps of the method for fabricating the semiconductor device according to the first embodiment.

First, as shown in FIG. 1, a first thermal oxide film 2 composed of a silicon dioxide film and a silicon nitride film 3 are formed successively on, e.g., a p-type silicon substrate 1. Then, the first thermal oxide film 2 and the silicon nitride film 3 are patterned by using a resist pattern 4 covering an element formation region.

Figure 2:
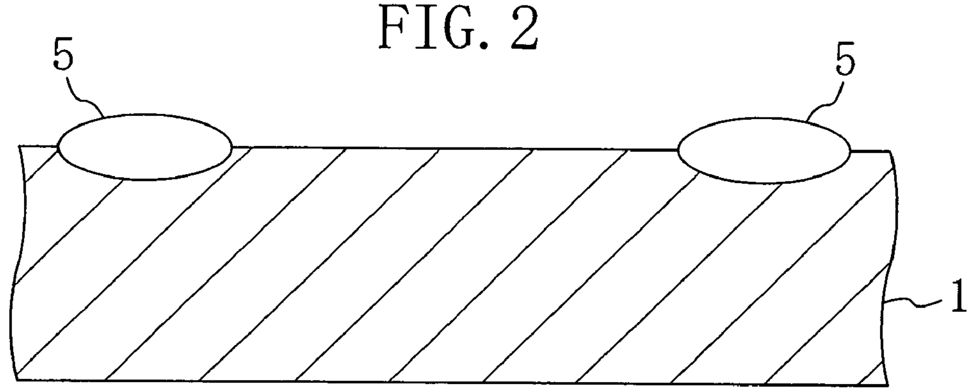
FIG. 2 is a cross-sectional view illustrating one of the process steps of the method for fabricating the semiconductor device according to the first embodiment.

Next, the resist pattern 4 is removed and then the silicon substrate 1 is thermally oxidized by using the patterned silicon nitride film 3 as a mask so that a field oxide film 5 serving as a LOCOS isolation is formed, as shown in FIG. 2. Thereafter, the remaining portions of the silicon nitride film 3 and the first thermal oxide film 2 are removed, whereby an isolation structure is completed.

Figure 3:
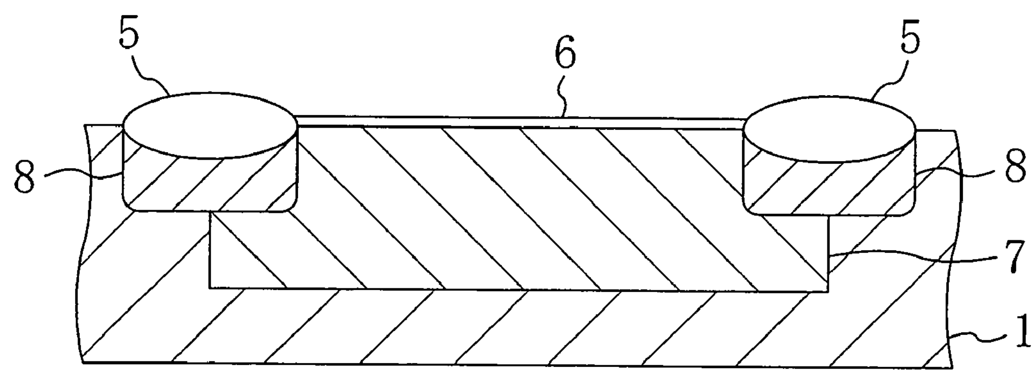
FIG. 3 is a cross-sectional view illustrating one of the process steps of the method for fabricating the semiconductor device according to the first embodiment.

Next, as shown in FIG. 3, a second thermal oxide film 6 composed of a silicon dioxide film is formed on the silicon substrate 1. Then, ion implantation of, e.g., phosphorus (for forming a well and a channel stopper) and ion implantation of, e.g., boron (for channel doping) are performed with respect to the silicon substrate 1. Thereafter, the silicon substrate 1 is annealed in a nitrogen atmosphere. As a result, an N-well region 7 and a channel stopper region 8 are formed in the silicon substrate 1, as shown in FIG. 3.

Figure 4:
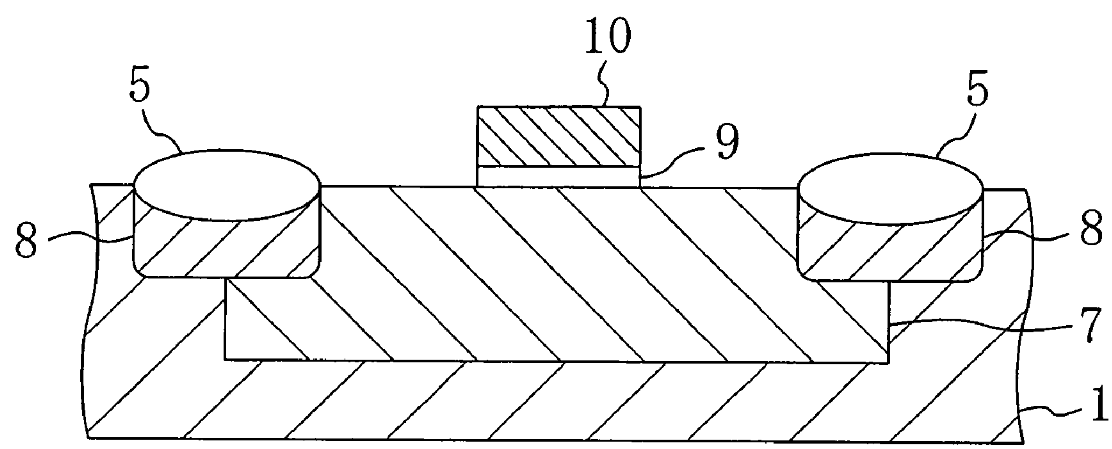
FIG. 4 is a cross-sectional view illustrating one of the process steps of the method for fabricating the semiconductor device according to the first embodiment.

Next, as shown in FIG. 4, the second thermal oxide film 6 is removed and then a gate electrode 10 is formed on the silicon substrate 1 with a gate insulating film 9 interposed between the silicon substrate 1 and the gate electrode 10 by photolithography and dry etching.

Figure 5:
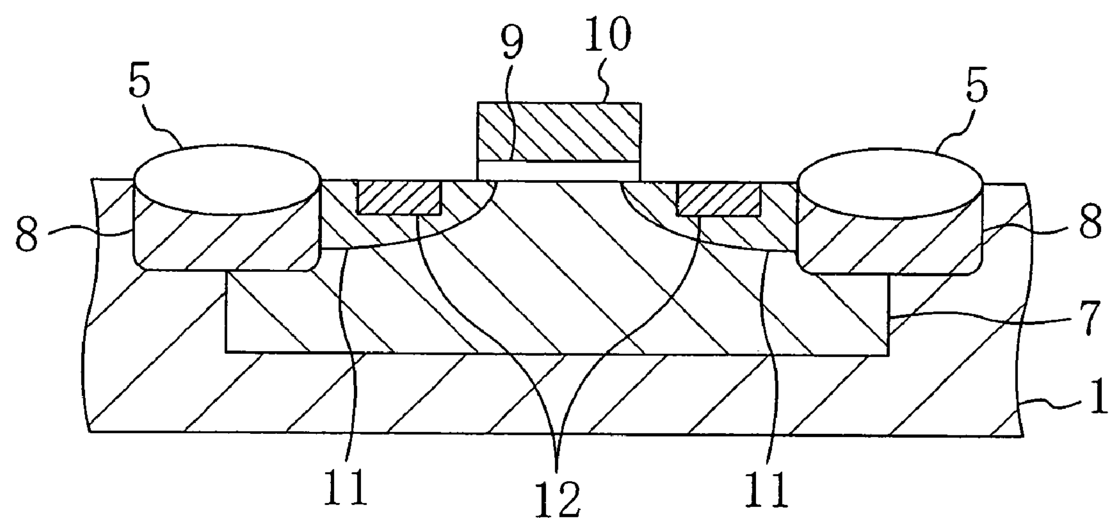
FIG. 5 is a cross-sectional view illustrating one of the process steps of the method for fabricating the semiconductor device according to the first embodiment.

Next, as shown in FIG. 5, ion implantation of, e.g., boron is performed with respect to the silicon substrate 1 by using the gate electrode 10 as a mask so that low-concentration impurity diffusion layers 11 are formed in the silicon substrate 1. Subsequently, ion implantation of, e.g., boron difluoride ($BF_2$) is performed with respect to the silicon substrate 1 by using the gate electrode 10 as a mask so that high-concentration impurity diffusion layers 12 serving as source and drain regions are formed in the silicon substrate 1, whereby a transistor composed of the gate electrode 10, the high-concentration impurity diffusion layers 12, and the like is formed.

Figure 6:
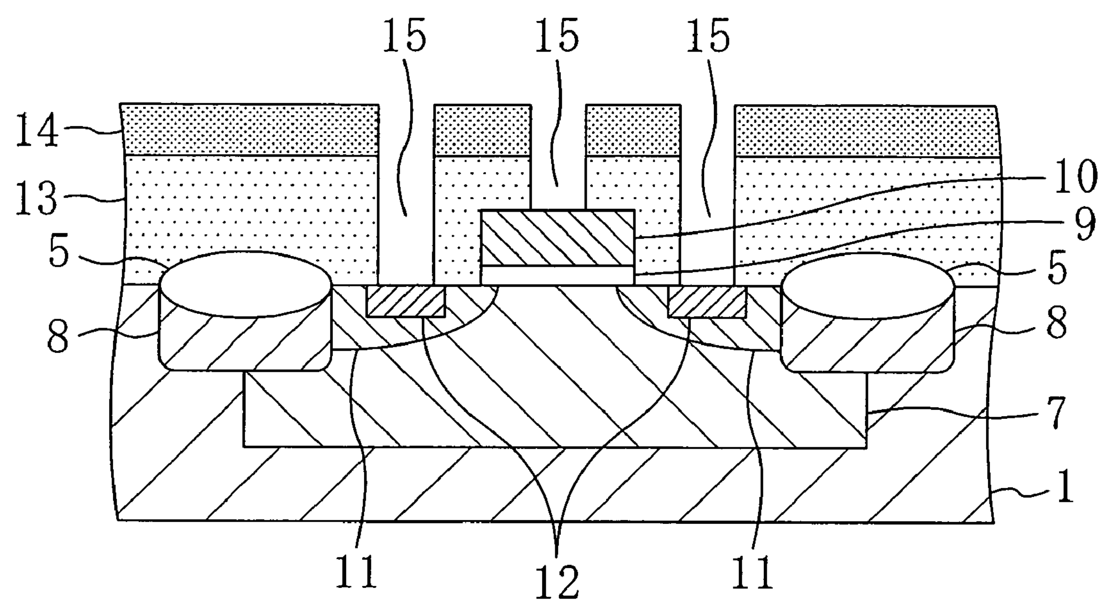
FIG. 6 is a cross-sectional view illustrating one of the process steps of the method for fabricating the semiconductor device according to the first embodiment.

Next, as shown in FIG. 6, a first interlayer insulating film 13 is deposited on the silicon substrate 1 and planarized by a reflow process. Then, dry etching using a resist pattern 14 as a mask is performed with respect to the first interlayer insulating film 13, thereby forming first contact holes 15 reaching the transistor described above.

Figure 7:
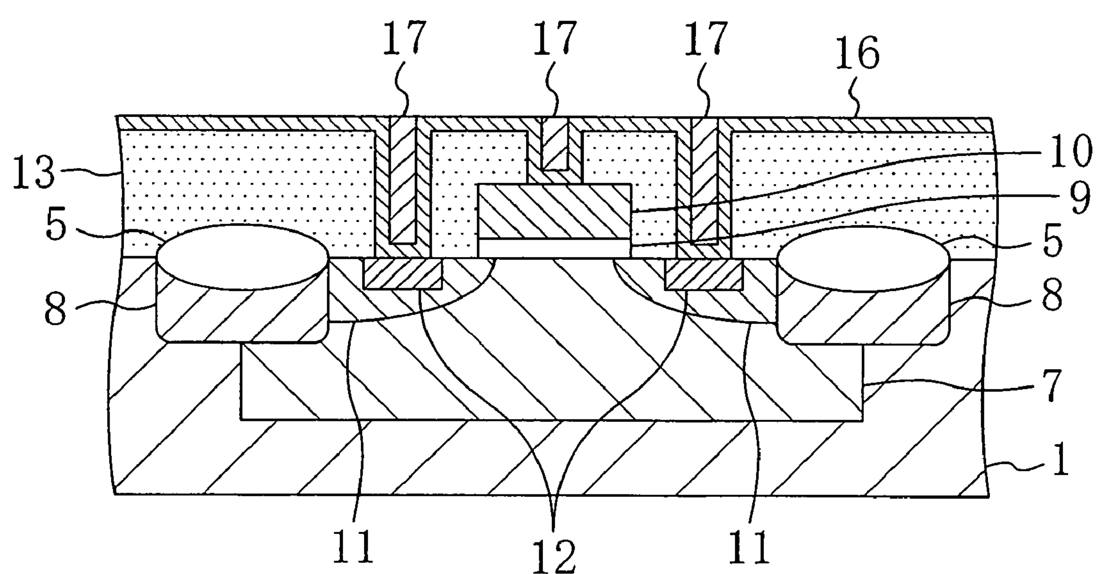
FIG. 7 is a cross-sectional view illustrating one of the process steps of the method for fabricating the semiconductor device according to the first embodiment.

Next, as shown in FIG. 7, the resist pattern 14 is removed. Then, a first barrier metal film 16 composed of, e.g., a multilayer thin film consisting of, e.g., a titanium film and a titanium nitride film or the like is deposited on the first interlayer film 13 such that the first contact holes 15 are filled midway therewith. Subsequently, a tungsten film is deposited by, e.g., CVD (chemical vapor deposition) on the first barrier metal film 16 such that the first contact holes 15 are filled completely therewith. Thereafter, the portion of the tungsten film located outside the first contact holes 15 is removed by an etch-back process, whereby first plugs 17 composed of the tungsten film are formed in the first contact holes 15.

Figure 8:
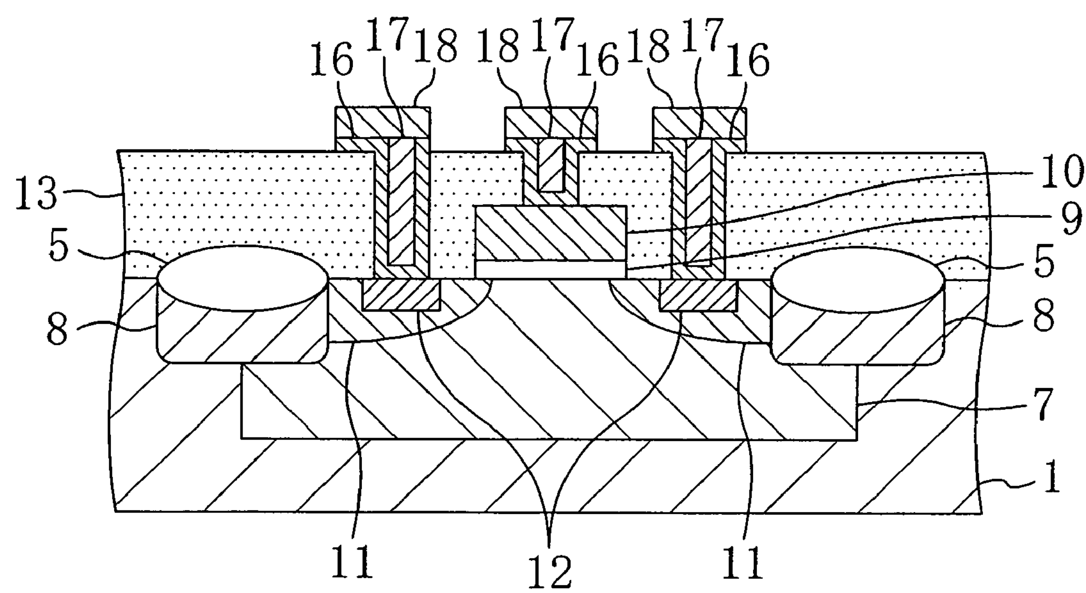
FIG. 8 is a cross-sectional view illustrating one of the process steps of the method for fabricating the semiconductor device according to the first embodiment.

Next, a metal film composed of, e.g., aluminum is formed on the first interlayer insulating film 13 and patterned by photolithography and dry etching to form a first wire 18 connected electrically to the transistor (composed of the gate electrode 10, the high-concentration impurity diffusion layers 12, and the like) via the first plugs 17, as shown in FIG. 8. At this time, the portion of the first barrier metal film 16 located outside the first wire 18 is removed.

Figure 9:
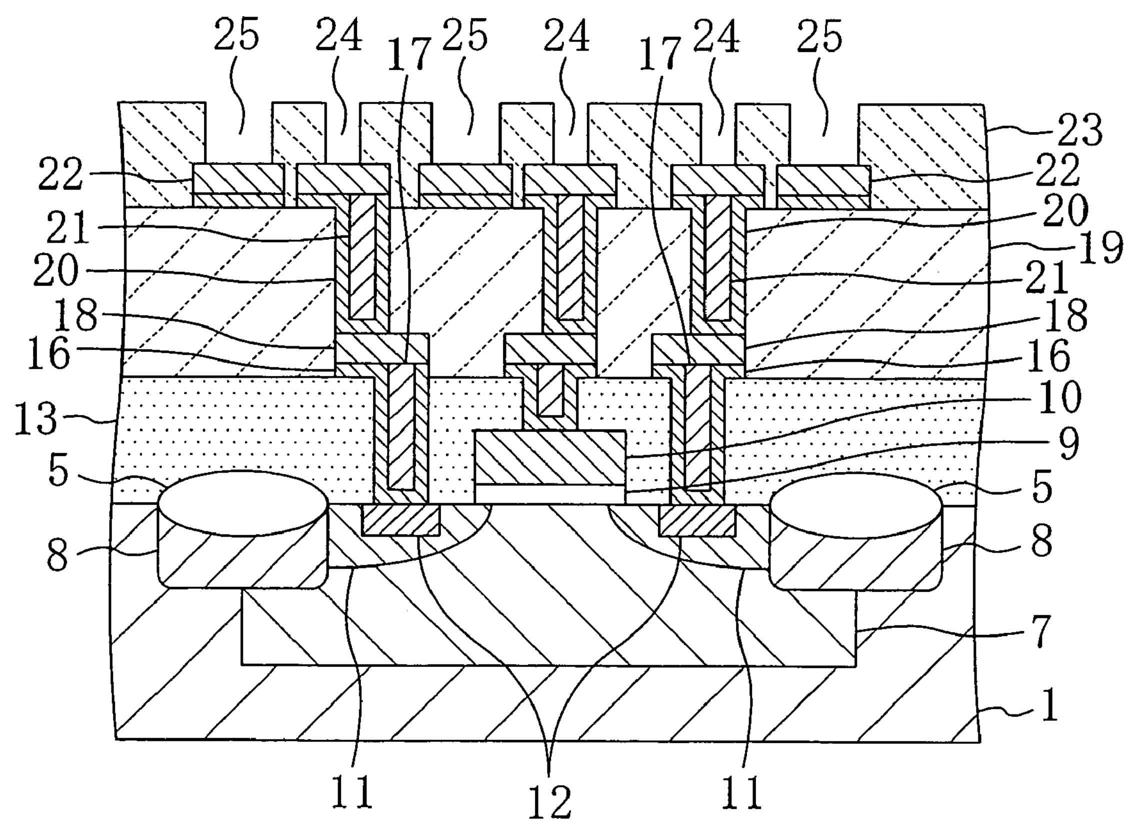
FIG. 9 is a cross-sectional view illustrating one of the process steps of the method for fabricating the semiconductor device according to the first embodiment.

Next, as shown in FIG. 9, a second interlayer insulating film 19 composed of, e.g., a plasma insulating film is deposited on the first interlayer insulating film 13 and then planarized. Then, in the same manner as in the steps shown in, e.g., FIGS. 6 to 8, second contact holes reaching the first wire 18 are formed in the second interlayer insulating film 19 and a second barrier metal film 20 is deposited on the second interlayer insulating film 19 such that the second contact holes are filled midway therewith. Subsequently, second plugs 21 composed of, e.g., a tungsten film are formed in the second contact holes. After that, a second wire 22 composed of, e.g., an aluminum film or the like and connected electrically to the transistor via the second plugs 21, the first wire 18, and the first plugs 17 is formed. At that time, the portion of the second barrier metal film 20 located outside the second wire 22 is removed. Thereafter, a plasma nitride film (silicon nitride film) 23 is formed on the second interlayer insulating film 19. Then, first depressed portions 24 and second depressed portions 25 larger than the first depressed portions 24 are formed in the plasma nitride film 23 such that each of the first depressed portions 24 and the second depressed portions 25 reaches the second wire 22, whereby electrode pads for product composed of the regions of the second wire 22 underlying the first depressed portions 24 and electrode pads for test (to be used specifically for a wafer-level burn-in) composed of the regions of the second wire 22 underlying the second depressed portions 25 are formed.

Figure 10:
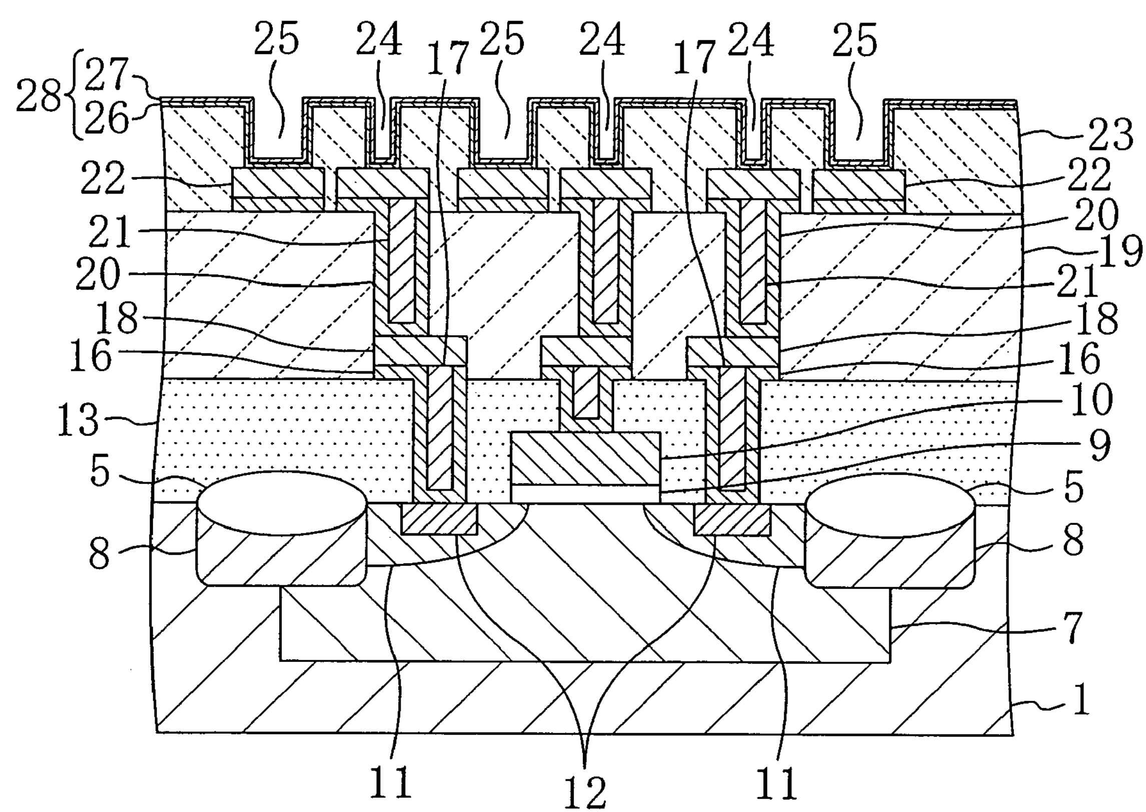
FIG. 10 is a cross-sectional view illustrating one of the process steps of the method for fabricating the semiconductor device according to the first embodiment.

Next, as shown in FIG. 10, a third barrier metal film 28 composed of a multilayer thin film of, e.g., a Ti/W multilayer film 26 (multilayer film consisting of a lower-layer titanium and an upper-layer tungsten film) and a gold film 27 is formed over the entire surface of the plasma nitride film 23 including the first and second depressed portions 24 and 25, i.e., over the product electrode pads, the test electrode pads, and the plasma nitride film 23. The third barrier metal film 28 is for easier plating growth of a gold film in the subsequent gold bump forming step.

Figure 11:
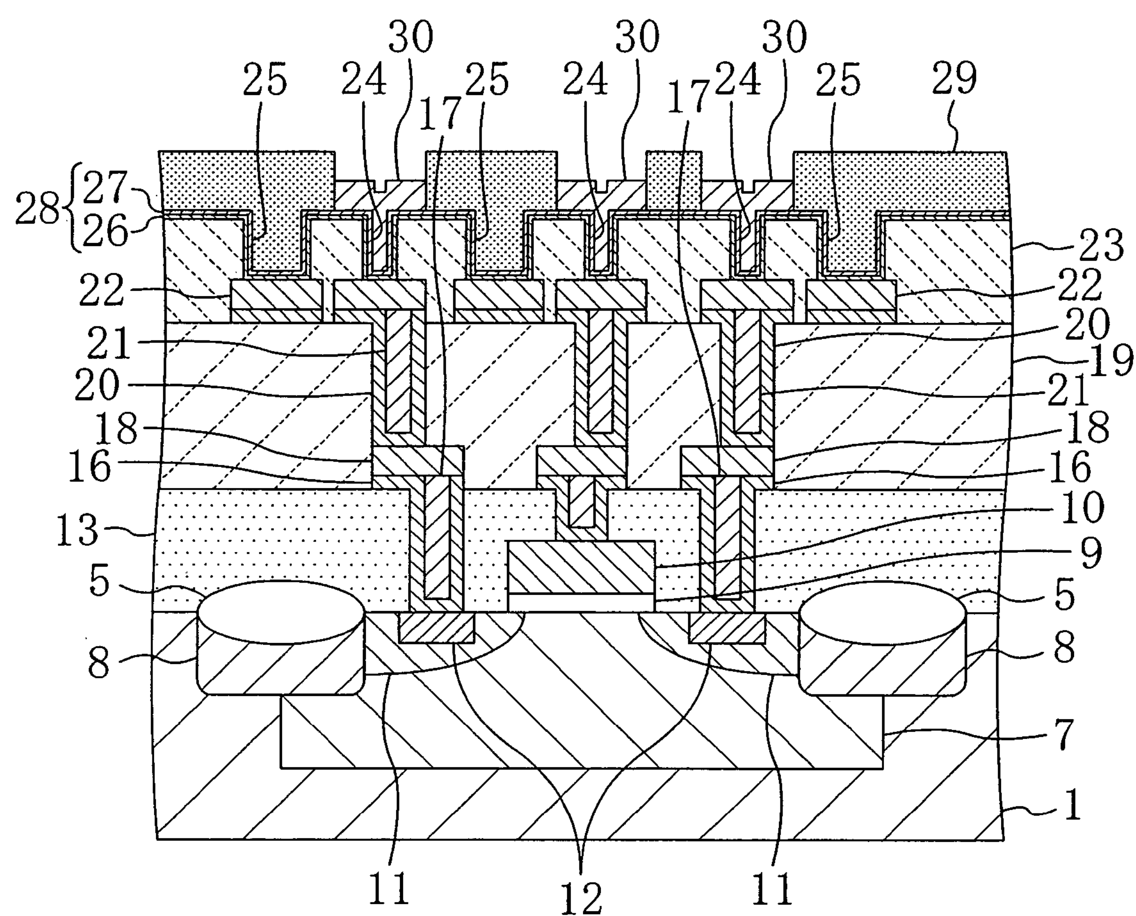
FIG. 11 is a cross-sectional view illustrating one of the process steps of the method for fabricating the semiconductor device according to the first embodiment.

Next, as shown in FIG. 11, a gold film is grown by plating on the third barrier metal film 28 by using, as a mask, a resist pattern 29 having openings over the product electrode pads provided in the gold bump formation regions, i.e., in the first depressed portions 24, whereby gold bumps 30 are formed on the product electrode pads via the third barrier metal film 28. At that time, the gold bumps 30 are formed to fill up completely the first depressed portions 24, to protrude upwardly from the first depressed portions 24, and to be larger in size in two dimensions than the first depressed portions 24.

Figure 12:
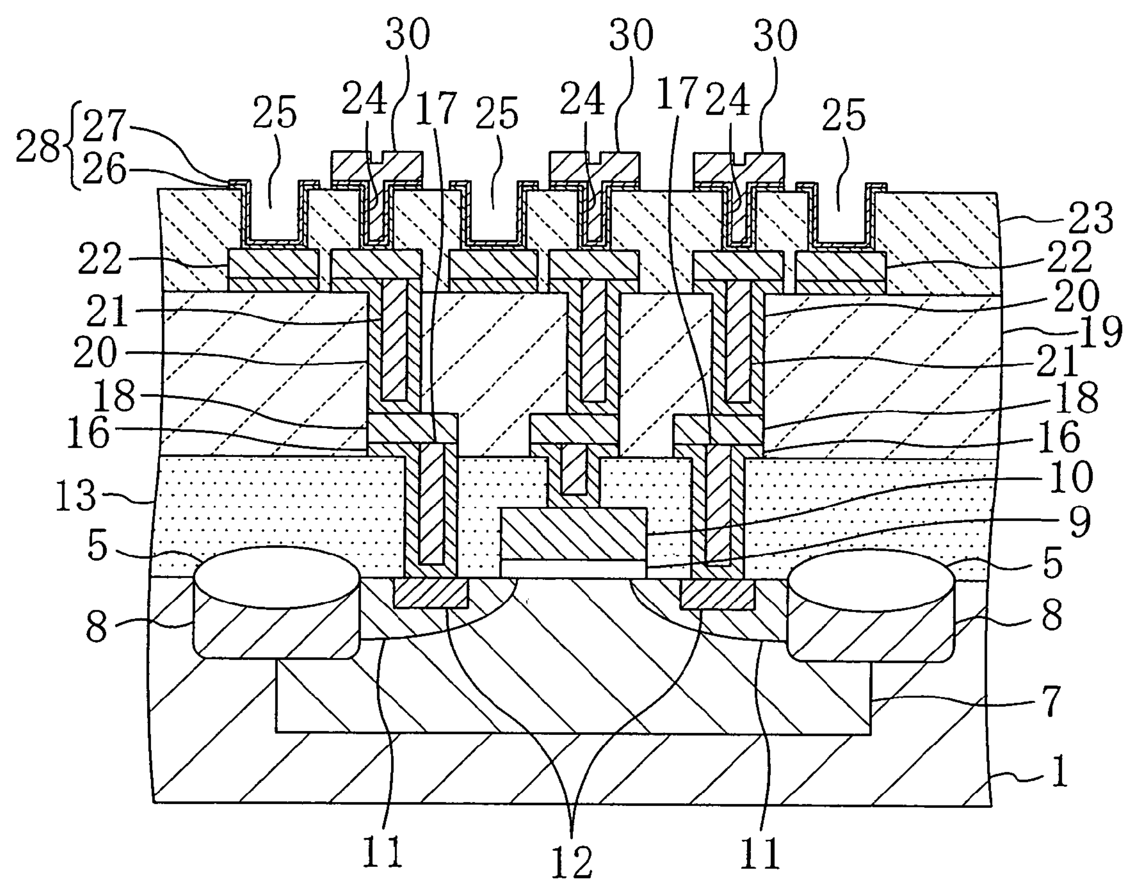
FIG. 12 is a cross-sectional view illustrating one of the process steps of the method for fabricating the semiconductor device according to the first embodiment.

Next, as shown in FIG. 12, the resist pattern 29 is removed and then the regions of the third barrier metal film 28 located between the depressed portions (the first and second depressed portions 24 and 25) are removed by photolithography and wet etching. Specifically, the portions of the third barrier metal film 28 connecting the electrode pads (the product electrode pads and the test electrode pads) to each other are cut off, while the third barrier metal film 28 is left on each of the electrode pads. By the foregoing steps, the product electrode pads connected electrically to the transistor (composed of the gate electrode 10, the high-concentration impurity diffusion layers 12, and the like) on the silicon substrate 1 and having the gold bumps 30 provided on the surfaces thereof and the test electrode pads connected electrically to the same transistor and having no gold bump provided on the surfaces thereof are completed.

Figure 13:
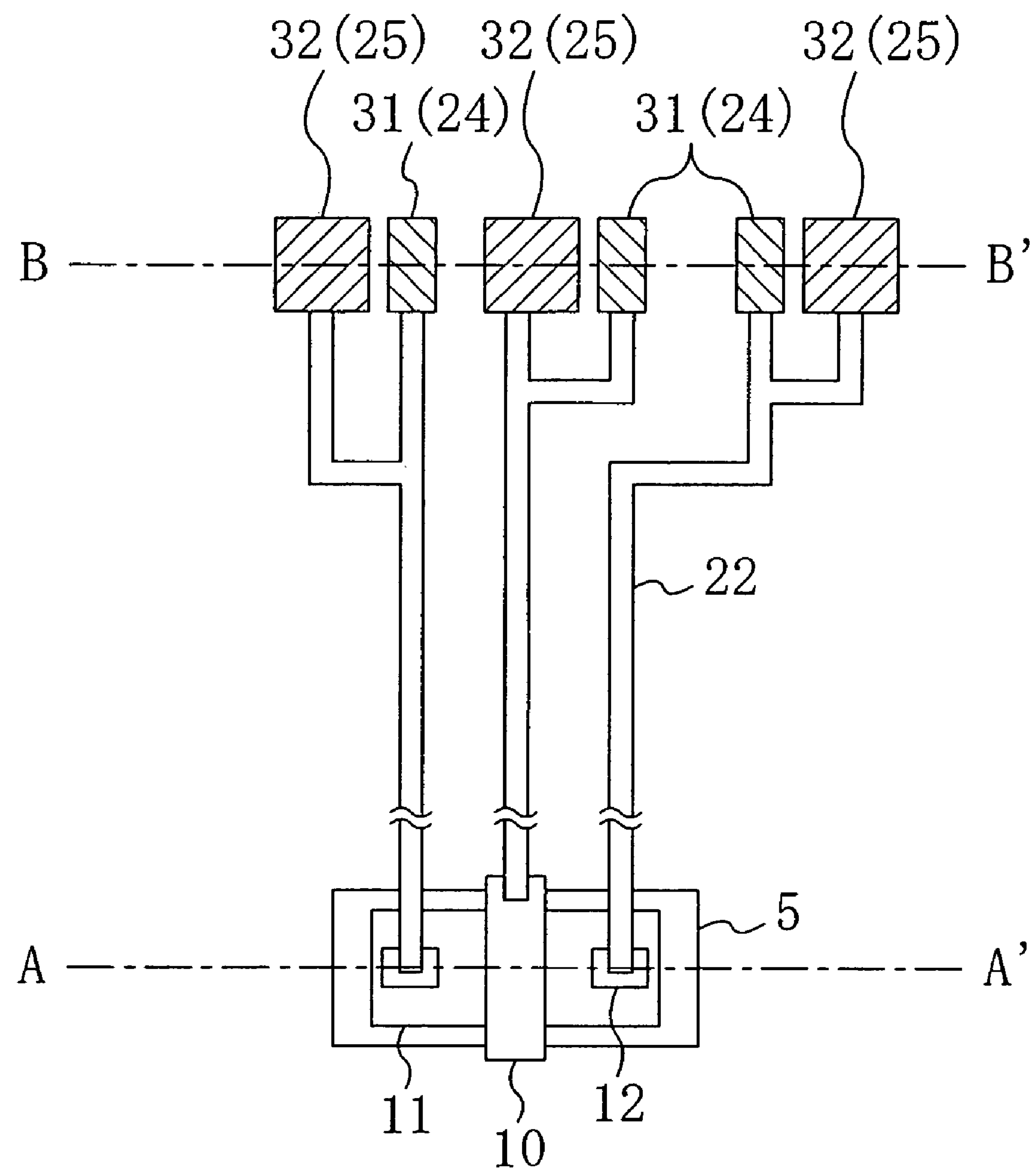
FIG. 13 diagrammatically shows a plan structure of an electrode pad for product, an electrode pad for test, a wire, and a transistor in the semiconductor device according to the first embodiment.

FIG. 13 diagrammatically shows a plan structure of the product electrode pads, the test electrode pads, the wiring, and the transistor in a semiconductor device fabricated by the steps shown in FIGS. 1 to 12, i.e., in the semiconductor device according to the first embodiment. The step cross-sectional views shown in FIGS. 9 to 12 are obtained by combining the cross-sectional views taken along the lines AA' and BB' in FIG. 13.

As shown in FIG. 13, the product electrode pads 31 (the regions of the second wire 22 underlying the first depressed portions 24 shown in FIGS. 9 to 12) and the test electrode pads 32 (the regions of the same second wire 22 underlying the second depressed portions 25) are connected electrically to the transistor composed of the gate electrode 10, the high-concentration impurity diffusion layers 12 (source and drain regions), and the like. As shown in FIG. 13, the plurality of product electrode pads 31 and the plurality of test electrode pads 32 are positioned on the same straight line in the first embodiment.

Thus, according to the first embodiment, the test electrode pads 32 to be used specifically for a wafer-level burn-in are formed in addition to the product electrode pads 31 having gold bumps 30 provided on the surfaces thereof This allows contact between the test electrode pads 32 and the electrode terminals of a burn-in system without using the product electrode pads 31 provided with metal bumps which are difficult to bring into contact with the electrode terminals of the burn-in system so that a burn-in is performed stably.

Since the third barrier metal film 28 is formed on the surfaces of the test electrode pads 32, corrosion of the test electrode pads 32 in an atmosphere can be prevented so that a highly reliable wafer-level burn-in is performed in the first embodiment.

Since the plurality of product electrode pads 31 and the plurality of test electrode pads 32 are positioned on the same straight line, layout of an integrated circuit can be performed easily in the first embodiment.

In addition, the first embodiment has formed the first and second depressed portions 24 and 25 in the plasma nitride film 23 on the silicon substrate 1 formed with the transistor and the wiring such that the first and second depressed portions 24 and 25 reach the second wire 22 and thereby formed the product electrode pads 31 composed of the regions of the second wire 22 underlying the first depressed portions 24 and the test electrode pads 32 composed of the regions of the second wire 22 underlying the second depressed portions 25. This allows contact between the electrode terminals of the burn-in system and the test electrode pads 32 with the electrode terminals of the burn-in system being fitted in the second depressed portions 25 so that a wafer-level burn-in is performed more stably. Since metal bumps are not provided on the test electrode pads 32 in the second depressed portions 25, there is no probability of a short circuit occurring between the test electrode pad 32 and another terminal in the semiconductor device when the semiconductor device is assembled in a package.

Moreover, the first embodiment has formed the third barrier metal film 28 entirely over the product electrode pads 31 (the first depressed portions 24) and the test electrode pads 32 (the second depressed portions 25), and the plasma nitride film 23, formed the gold bumps 30 on the product electrode pads 31, and then cut off the portions of the third barrier metal film 28 connecting the individual electrode pads. This allows the third barrier metal 28 for forming the gold bumps 30 on the product electrode pads 31 to be formed easily also on the test electrode pads 32.

Although the first embodiment has used a p-type as the conductivity type of the substrate, used a LOCOS isolation method as an isolation method, used two-layer wiring as a wiring structure, and used aluminum as a material composing the wiring, the present invention is not limited thereto. It is also possible to use, e.g., an n-type as the conductivity type of the substrate, a trench isolation method as an isolation method, multilayer wiring consisting of three or more layers as a wiring structure, and copper or the like as a material composing the wiring.

Although the present invention has been applied to the transistor having a typical MOS structure in the first embodiment, it is also possible to apply the present invention to a high voltage transistor which is provided with an offset region using, e.g., a field oxide film, a mask, or the like.

If each of the product electrode pads 31 is configured as a rectangle in the first embodiment, the long and short sides of the rectangle are, e.g., about 70 $\mu$m and about 35 to 70 $\mu$m and the pitch distance between the product electrode pads 31 is, e.g., about 45 to 50 $\mu$m. In this case, each of the test electrode pads 32 is preferably configured as a square having the four sides of about 70 $\mu$m and the pitch distance between the test electrode pads 32 is preferably set to, e.g., about 160 $\mu$m. Alternatively, the area of each of the test electrode pads 32 is set to double the area of each of the product electrode pads 31 or more or the test electrode pad 32 are preferably disposed at the largest possible distance from the product electrode pad 31. The arrangement more easily allows contact between the test electrode pads 32 and the electrode terminals of the burn-in system.

Although the first embodiment has used the gold bumps 30 as metal bumps on the product electrode pads 31, a material composing the metal bumps is not particularly limited.

Although the first embodiment has formed the product electrode pads 31 or the test electrode pads 32 by forming the depressed portions in the insulating film on the wiring, a method for forming the product electrode pads 31 or the test electrode pads 32 is not particularly limited.

Variation of Embodiment 1

Referring to the drawings, a semiconductor device according to a variation of the first embodiment of the present invention will be described.

Figure 14:
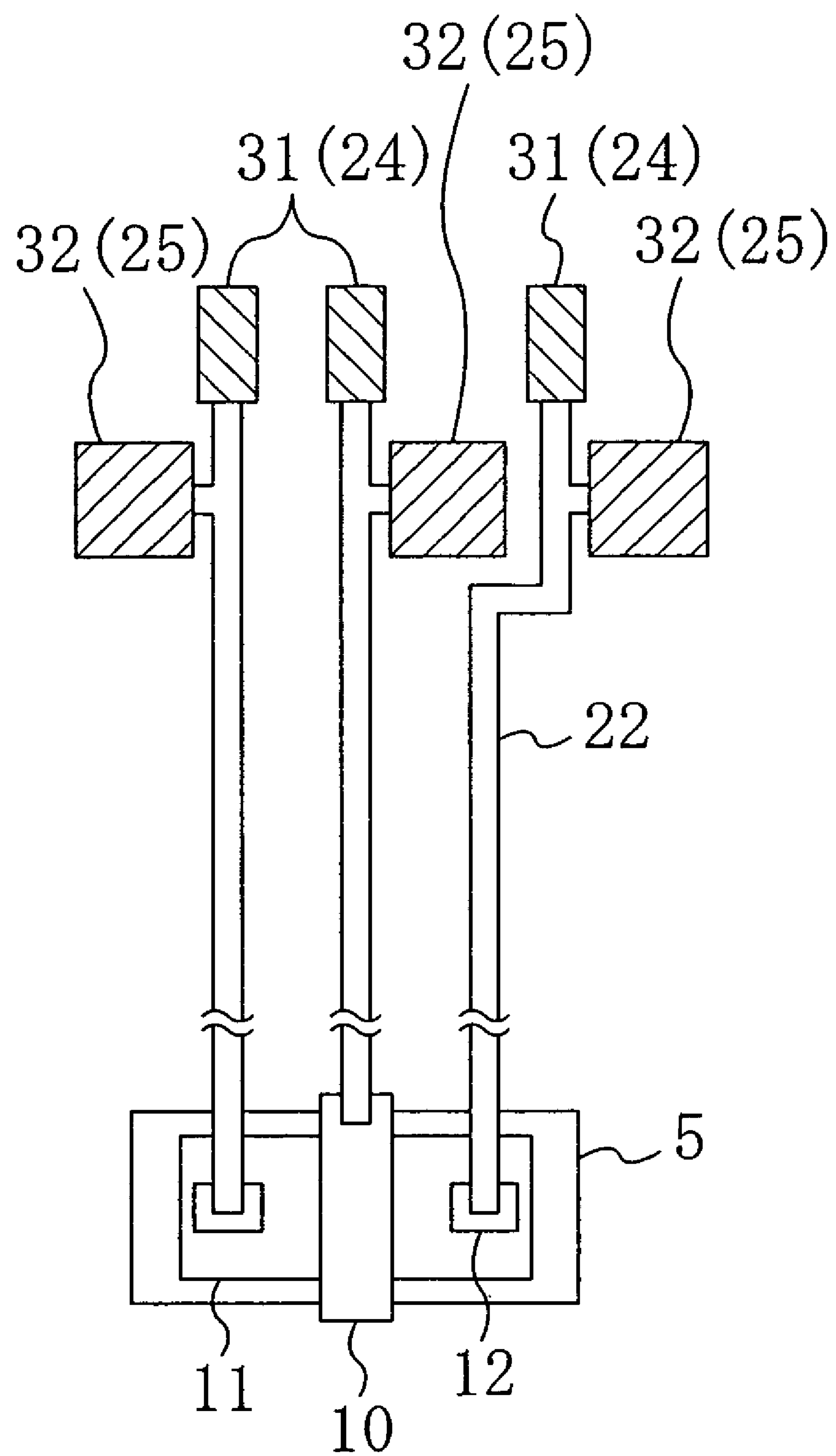
FIG. 14 diagrammatically shows a plan structure of an electrode pad for product, an electrode pad for test, a wire, and a transistor in a semiconductor device according to a variation of the first embodiment of the present invention.

FIG. 14 diagrammatically shows a plan structure of product electrode pads, test electrode pads, wiring, and a transistor in the semiconductor device according to the variation of the first embodiment.

The variation of the first embodiment is different from the first embodiment in the positional relationship between the product electrode pads 31 and the test electrode pads 32. In the first embodiment, the plurality of product electrode pads 31 and the plurality of test electrode pads 32 are positioned on the same straight line, as shown in FIG. 13, which allows easy layout of an integrated circuit. In the variation of the first embodiment, by contrast, each of the test electrode pads 32 is provided between the second wires 22 connected to the product electrode pad 31. The arrangement achieves the effect of reducing the area of the integrated circuit, i.e., the chip size.

Embodiment 2

Referring to the drawings, a wafer-level burn-in method according to a second embodiment of the present invention will be described. The second embodiment performs a burn-in with respect to a semiconductor wafer provided with a plurality of semiconductor devices according to, e.g., the first embodiment as semiconductor integrated circuit chips (hereinafter referred to as chips). Specifically, the second embodiment performs a burn-in with respect to the semiconductor wafer provided with the plurality of chips each having a transistor, electrode pads for product (e.g., the product electrode pads 31 according to the first embodiment) connected electrically to the transistor and having metal bumps on the surfaces thereof, and electrode pads for test (e.g., the test electrode pads 32 according to the first embodiment) connected electrically to the transistor to be used specifically for a wafer-level burn-in.

Figure 15:
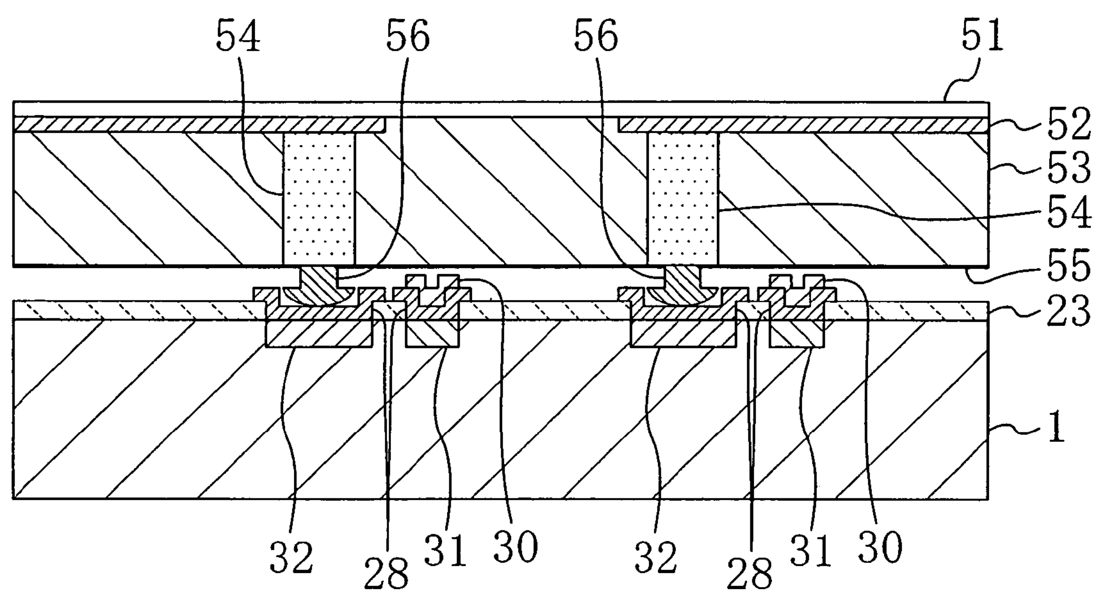
FIG. 15 is a cross-sectional view showing a burn-in system in contact with a semiconductor wafer in accordance with a wafer-level burn-in method according to a second embodiment of the present invention.

FIG. 15 is a cross-sectional view showing a burn-in system in contact with the semiconductor wafer in the wafer-level burn-in method according to the second embodiment. The description of the components shown in FIG. 15 which are the same as used in the semiconductor device according to the first embodiment shown in FIGS. 1 to 13 will be omitted by retaining the same reference numerals. For the sake of simplicity, FIG. 15 shows the semiconductor device according the first embodiment in a simplified structure.

In the burn-in system, an extraction wire 52 is formed on the lower surface of a glass wiring substrate 51 and an anisotropic conductive rubber 53 is formed to cover the lower surface of the glass wiring substrate 51 including the extraction wire 52, as shown in FIG. 15. In the anisotropic conductive rubber 53, a conductive particle layer 54 connected to the extraction wire 52 is formed. The lower surface of the anisotropic conductive rubber 53 is covered with a sheet 55 provided with metal bumps 56 connected to the conductive particle layer 54 and serving as electrode terminals. The metal bumps 56 are composed of, e.g., gold.

On the other hand, the product electrode pads 31 and the test electrode pads 32 connected electrically to the transistor (not shown) are formed on a per chip basis on the semiconductor wafer (silicon substrate 1) on which the burn-in is to be performed. The product electrode pads 31 and the test electrode pads 32 are formed by forming depressed portions in an insulating film (the plasma nitride film 23) formed on wiring (not shown) on the chips of the silicon substrate 1. A barrier metal film (third barrier metal film 28) is formed on the product electrode pads 31 and on the test electrode pads 32, while metal bumps (gold bumps 30) are formed on the product electrode pads 31 via the barrier metal film.

During the wafer-level burn-in, the burn-in can be performed by bringing the metal bumps 56 of the burn-in system into electrical contact with the test electrode pads 32 on the individual chips, as shown in FIG. 15, and thereby allowing a current to flow from the burn-in system to each of the chips. Since the test electrode pads 32 are formed by using the depressed portions in the plasma nitride film 23, the metal bumps 56 of the burn-in system fit into the depressed portions so that stable electric contact is provided between the metal bumps 56 and the test electrode pads 32.

During the wafer-level burn-in, it is necessary to prevent contact between the gold bumps 30 on the product electrode pads 31 of each of the chips and the burn-in system. Specifically, it is necessary to adjust the height of each of the metal bumps 56 of the burn-in system to be larger than the height of each of the gold bumps 30 (the height of the gold bump 30 includes the height of the portion thereof formed in the depressed portion if the product electrode pad 31 is formed in the depressed portion).

Figure 16:
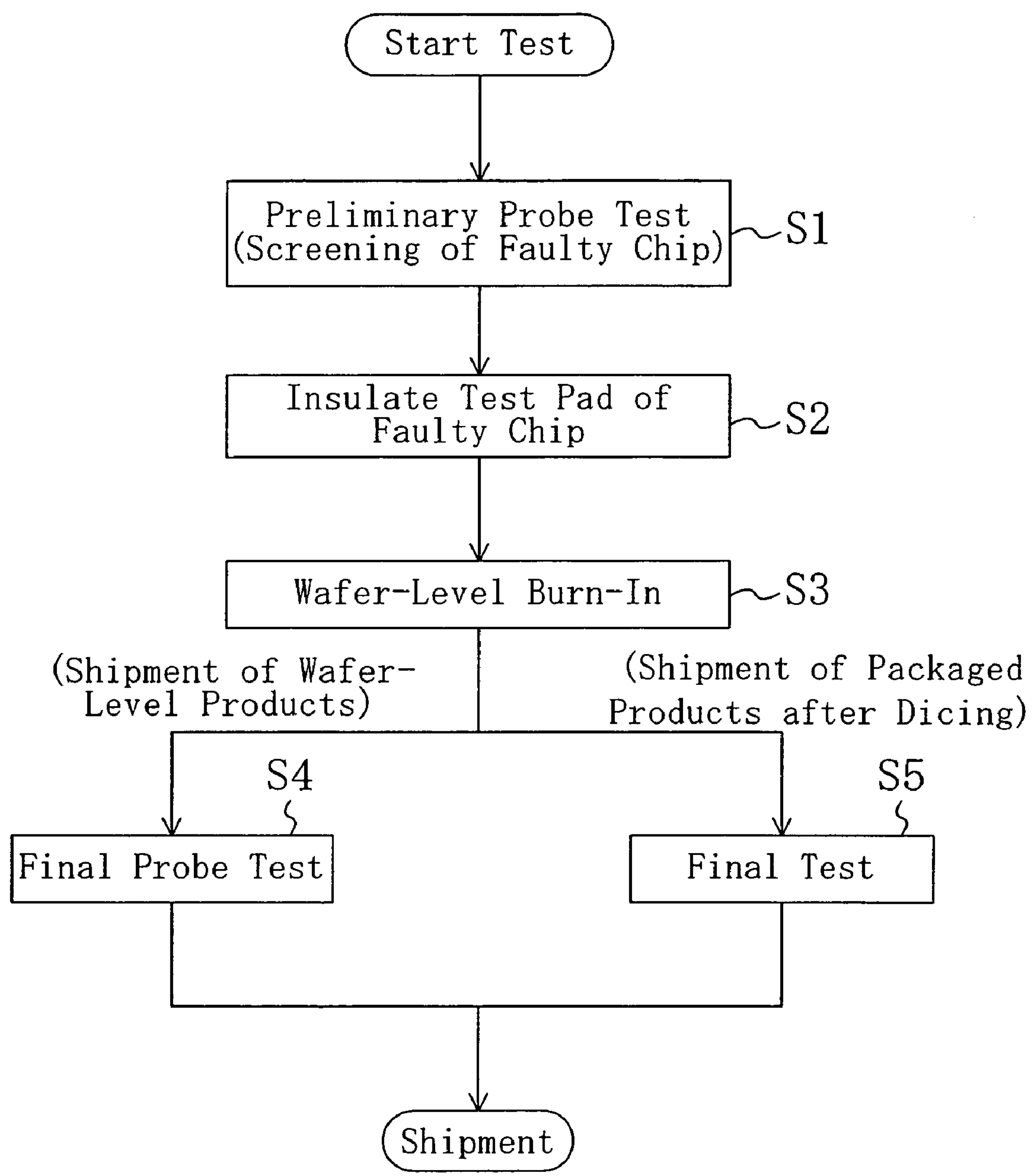
FIG. 16 is a flow chart illustrating a method for testing a semiconductor integrated circuit by using the wafer-level burn-in method according to the second embodiment.
Figure 17:
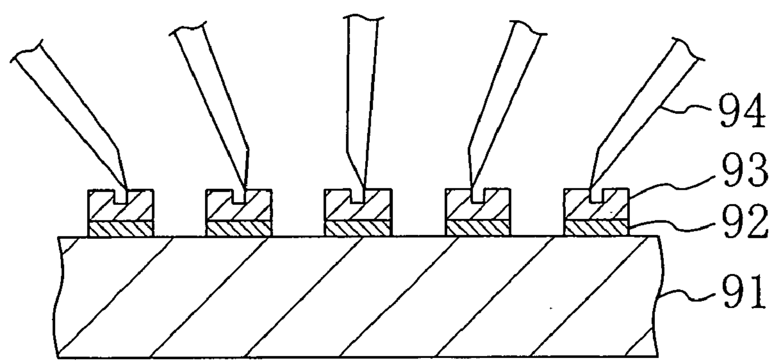
FIG. 17 shows a probe test performed on a conventional product with metal bumps.
Figure 18:
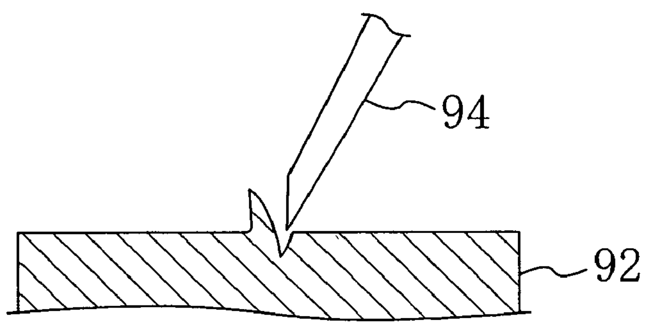
FIG. 18 shows a probe test performed on the conventional product with metal bumps before the bumps are provided therein.
Figure 19:
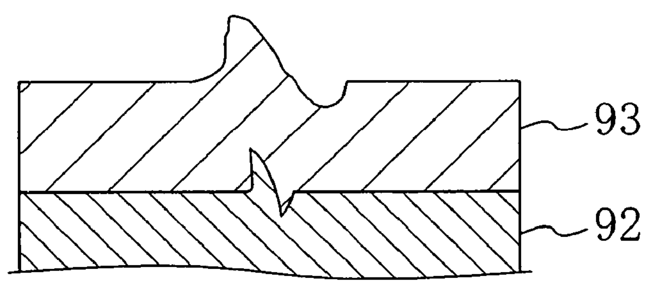
FIG. 19 illustrates problems encountered when metal bumps are grown by plating after a probe test is performed on the conventional product with metal bumps before the bumps are provided therein.
Figure 20:
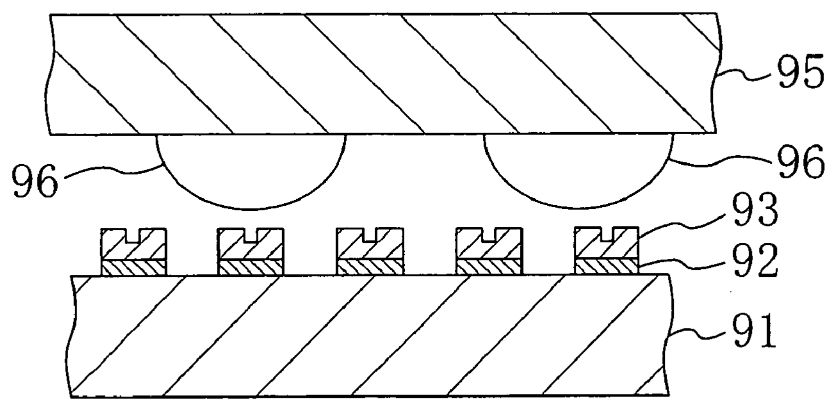
FIG. 20 shows a wafer-level burn-in performed on trial by the present inventors on a product with metal bumps prior to dicing.

FIG. 16 is a flow chart illustrating a method for testing a semiconductor integrated circuit using a wafer-level burn-in method according to the second embodiment.

Before the wafer-level burn-in is performed, a probe test (preliminary probe test) using the product electrode pads 31 is performed first with respect to the plurality of chips of the semiconductor wafer in Step S1. This allows a chip which is already faulty in the wafer level state to be screened before the burn-in is performed. Specifically, it is examined whether each of the chips operates normally by bringing the probe terminals (not shown) of a probe tester into contact with the product electrode pads 31. The chip determined to be faulty (hereinafter referred to as a faulty chip) in the preliminary probe test is not subjected to the subsequent wafer-level burn-in (Step S3).

Next, in Step S2, an insulating treatment is performed with respect to the test electrode pad 32 of the faulty chip. Specifically, an insulating resin is coated on the test electrode pad 32 of the faulty chip. This prevents electrical conduction between the test electrode pad 32 of the faulty chip and the electrode terminal (metal bump 56) of the burn-in system during the wafer-level burn-in so that the burn-in is not performed with respect to the faulty chip. The reason for preventing the burn-in from being performed with respect to the faulty chip is as follows. That is, if the burn-in is performed with respect to the faulty chip, a current is localized to the faulty chip during the burn-in so that the current does not flow to the chip determined to be good (hereinafter referred to as the good chip) in the preliminary probe test in Step S1. As a result, the burn-in cannot be performed any more.

Next, in Step S3, a wafer-level burn-in is performed by using the test electrode pads 32 with respect to the good chip as shown in, e.g., FIG. 15. Specifically, the metal bump 56 of the burn-in system are brought into contact with the test electrode pads 32 of the good chips and a specified current is applied from the burn-in system to each of the chips for a given period of time.

Next, in Step S4, for the products to be shipped in the wafer level state, a probe test (final probe test) is performed on the good chip by using the product electrode pads 31. Specifically, it is examined whether the good chip operates normally by bringing the probe terminals (not shown) of the probe tester into contact with the product electrode pads 31. This is because, since there is a chip which was determined to be good in the preliminary probe test but has become faulty as a result of the wafer-level burn-in, shipment is performed after the screening of the faulty chip in Step S4.

For the products to be shipped as packaged items, on the other hand, a good chip is individualized by performing dicing with respect to the semiconductor wafer, packaging the individualized good chip, and then performing a final test with respect to the packaged good chip in Step S5. This is because, since there is a chip which was determined to be good in the preliminary probe test but has become faulty as a result of the wafer-level burn-in or an assembling step such as dicing or packaging, shipment is performed after the screening of the faulty chip in Step S5. It is also possible to perform an additional probe test on the products to be shipped as packaged items between the wafer-level burn-in in Step S3 and the assembling step so that the chip which has become faulty as a result of the wafer-level burn-in is screened.

Since the second embodiment allows contact between the test electrode pads 32 and the electrode terminals (metal bumps 56) of the burn-in system without using the product electrode pads 31 with metal bumps which are difficult to bring into contact with the electrode terminals of the burn-in system, the wafer-level burn-in can be performed stably.

The second embodiment also performs the preliminary probe test (Step S1) with respect to each of the chips and then performs the insulating treatment (Step S2) with respect to the test electrode pad 32 of a chip determined to be faulty prior to performing the wafer-level burn-in (Step S3). As a result, electrical conduction does not occur between the test electrode pad 32 of the faulty chip and the electrode terminal of the burn-in system during the wafer-level burn-in so that the burn-in is not performed with respect to the faulty chip. This prevents the localization of a current to the faulty chip and the situation in which the current does not flow to the good chip during the wafer-level burn-in so that the burn-in is performed reliably.

Since metal bumps are not provided on the test electrode pads 32 according to the second embodiment, the insulating treatment can be performed easily with respect to the test electrode pad 32 of the faulty chip.

What is claimed is:

1. A wafer-level burn-in method for performing a burn-in with respect to a semiconductor wafer provided with a plurality of semiconductor integrated circuit chips each having a transistor, an electrode for product connected electrically to the transistor and having a metal bump provided on a surface thereof, and an electrode pad for test connected electrically to the transistor to be used specifically for a wafer-level burn-in, the method comprising the steps of:

performing a probe test on the plurality of semiconductor integrated circuit chips by using the electrode pad for product;

performing an insulating treatment with respect to the electrode pad for test of the faulty one of the plurality of semiconductor integrated circuit chips determined to be faulty in the step of performing the probe test; and after the step of performing the insulating treatment, performing a wafer-level burn-in using the electrode pad for test with respect to the good one of the plurality of semiconductor integrated circuit chips determined to be good in the step of performing the probe test.

2. The method of claim 1, further comprising, after the step of performing the wafer-level burn-in, the step of:

performing a probe test on the good chip by using the electrode pad for product.

3. The method of claim 1, further comprising, after the step of performing the wafer-level burn-in, the step of:

individualizing the good chip by dicing the semiconductor wafer, packaging the individualized good chip, and then performing a final test on the packaged good chip.

4. The method of claim 1, wherein the step of performing the wafer-level burn-in is performed while preventing contact between the metal bump of the good chip and a burn-in system.

* * * * *